United States Patent [19]

Kempf

[11] Patent Number: 5,407,314

[45] Date of Patent: Apr. 18, 1995

[54] APPARATUS FOR SYNCHRONIZING LOADING AND UNLOADING OF SUBSTRATES WITH TURNTABLE MOVEMENT IN A COATING CHAMBER

[75] Inventor: Stefan Kempf, Alzenau, Germany

[73] Assignee: Leybold Aktiengesellschaft, Hanau, Germany

[21] Appl. No.: 130,378

[22] Filed: Oct. 1, 1993

[30] Foreign Application Priority Data

Oct. 1, 1992 [DE] Germany ............ 42 32 959

[51] Int. Cl.6 ............................................. B65G 29/00
[52] U.S. Cl. ................................... 414/217; 414/223; 414/939
[58] Field of Search .............. 414/217, 223, 744.3, 414/935, 939

[56] References Cited

U.S. PATENT DOCUMENTS

| | | |
|---|---|---|
| 3,874,525 | 4/1975 | Hassan et al. |
| 3,973,665 | 8/1976 | Giammanco .................. 198/19 |
| 4,027,767 | 6/1977 | Gluck ......................... 414/223 X |
| 4,318,767 | 3/1982 | Hijikata et al. ............. 414/939 X |
| 4,465,416 | 8/1984 | Burkhalter et al. ................ 414/217 |
| 4,674,621 | 6/1987 | Takahashi ..................... 414/217 X |
| 4,735,548 | 4/1988 | Kimata et al. ................. 414/744.3 |
| 4,820,106 | 4/1989 | Walde et al. ................... 414/217 |
| 4,969,790 | 11/1990 | Petz et al. ..................... 414/217 |
| 5,085,312 | 2/1992 | Ribordy et al. .............. 414/223 X |
| 5,112,469 | 5/1992 | Kempf et al. ................. 414/223 X |
| 5,135,635 | 8/1992 | Ikeda ......................... 414/217 X |

FOREIGN PATENT DOCUMENTS

| | | |
|---|---|---|
| 3912195 | 10/1990 | Germany . |
| 0132444 | 6/1988 | Japan .................. 414/217 |
| 1014789 | 9/1978 | U.S.S.R. . |

OTHER PUBLICATIONS

Droscha, Helmut: Vollautomatisches Handling Hochempfindlicher Massenteile . . . , Deutsche Heise und Fordentechnik Nov. 1976, pp. 21–23.
Bettinelli, "Indexing and Transfer" (product brochure.

*Primary Examiner*—Michael S. Huppert
*Assistant Examiner*—James W. Keenan
*Attorney, Agent, or Firm*—Felfe & Lynch

[57] ABSTRACT

Apparatus for loading and unloading disk-shaped substrates into and out of a vacuum coating chamber and for transporting the substrates within this chamber, having a first station for loading and unloading substrates, a second station where substrates are coated, a rotatable substrate holder for transferring substrates stepwise between stations, and first and second lifters for lifting substrates from the rotatable holder at respective first and second stations. A rotating cylinder has timing grooves in its cylindrical surface which guide pins on the bottom of a shaft fixed to the substrate holder in order to move it stepwise between stations. Timing grooves in opposed ends of the cylinder guide pins which move the lifters vertically during pauses between stepwise movements. A single motor thus controls all movements in the coating chamber.

5 Claims, 4 Drawing Sheets

APPARATUS FOR SYNCHRONIZING LOADING AND UNLOADING OF SUBSTRATES WITH TURNTABLE MOVEMENT IN A COATING CHAMBER

BACKGROUND OF THE INVENTION

The invention relates to an apparatus for loading and unloading disk-shaped substrates into and out of a vacuum coating chamber through airlocks and for transporting the substrates within this chamber, having at least one station for loading and unloading and at least one coating station, at least one lifting means and at least one rotatably mounted substrate holder, as well as a motor for operating the lifting means and the substrate holder.

In vacuum processing technology, especially in the thin-coating technology, the coating of substrates, such as compact disks (CD's) is well-known. These disk-shaped substrates are used widely as a means for storing digital data. In a sputtering process, the stamped plastic disks are covered with an aluminum coating. The sputtering apparatus used for this purpose have, in many cases, a turntable for transporting the substrates.

A rotating arm transports the substrates from a buffer of a handling system into the vacuum chamber. In the chamber the substrates are placed on a turntable and transported by the latter through the individual stations in the vacuum chamber. Usually at least two stations are provided in this chamber. These are a loading and unloading station, and a coating station.

U.S. Pat. No. 4,820,106 discloses an apparatus for loading and unloading a substantially flat workpiece into and out of an evacuated coating chamber through an airlock and for shifting the workpiece in and out of the range of the coating source for the purpose of treating the workpiece surface.

Also known is an apparatus of the kind in question (U.S. Pat. No. 3,874,525) which has a coating chamber in which a two-armed pick-up tool is mounted for rotation about a vertical axis. At its diametrically opposite extremities this two-armed pick-up tool has forks, which can be moved toward and away from one another in a vertical plane by means of a rack drive with motor. In another document (DE 39 12 295) a cathode sputtering apparatus for coating substrates in a vacuum chamber is described, in which a rotating substrate holder is housed, having at least one cathode station, and a loading and unloading station, the substrate holder including at least one transport tray.

To set these transport trays in a rotating movement it is proposed that, for one or more trays, a driving means centrally disposed with respect to the cathode sputtering apparatus be provided which advances the transport tray in the vacuum chamber in steps of a certain angular amount.

All these known apparatus have the disadvantage that the individual movements are performed by individual driving means. For example, for the raising and lowering of the swivel arm disposed in front of the chamber and for the raising and lowering of the substrate plates within the chamber, individual pneumatic cylinders are used. For the rotation of the swivel arm and turntable, electric motor drives, for example, are provided.

For the coordination of the individual movements a number of individual signals are necessary, which are accessed and operated through a system-programmable control. To process the individual signals a corresponding delay is necessary, in which no movements of the driving means can be performed. This in turn has a disadvantageous effect on the total length of the coating cycle. Since the apparatus in question are used exclusively for the coating of large quantities of substrates, and are usually run in three shifts, the cycle length is of considerable economic importance.

SUMMARY OF THE INVENTION

It is the purpose of the present, invention to better coordinate the movements of the individual driving means with one another in order thus to appreciably shorten the cycle length and increase the output of the apparatus in substrates per unit time.

According to the invention, this purpose is accomplished in that between the lifting means and the substrate holder on the one hand and the motor on the other a transmission is provided which produces both a lifting and a turning movement.

Due to this positive management of the individual lifting rods and substrate holders, the detection and processing of individual signals, through an SPS, for example, is advantageously eliminated. In one known embodiment of the apparatus in question, the total cycle length formerly required 3.3 seconds. With the design according to the invention, the cycle length was advantageously reduced to 2.5 seconds. This is an improvement of the cycle length by about 25% and hence an increase in productivity by about 32% measured in substrates per hour.

DETAILED DESCRIPTION OF THE PREFERRED EMBODIMENTS

Figure 1:
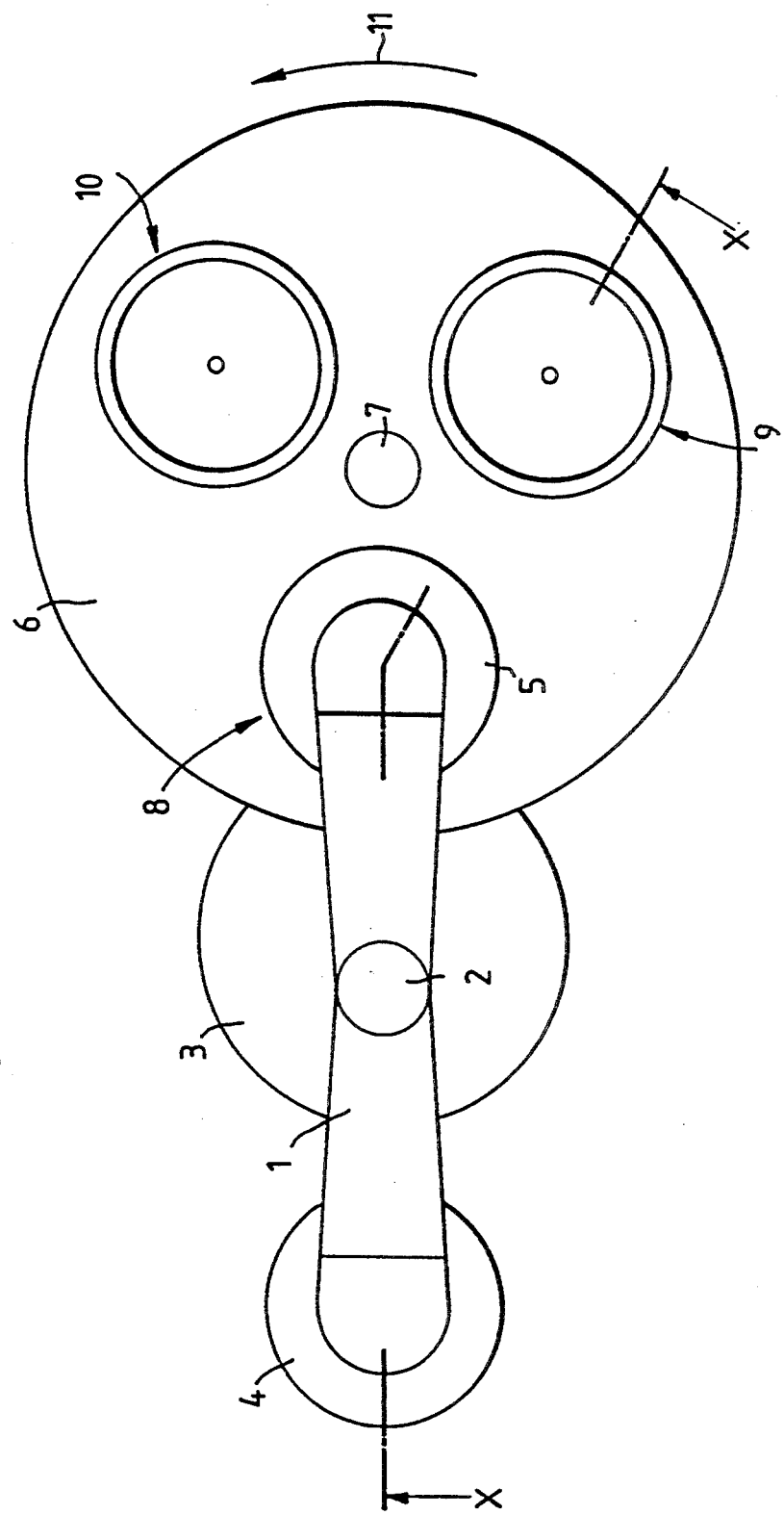
FIG. 1 shows a plan view of a swivel arm with two substrate holders and a turntable with three substrate stations.

A symmetrical swivel arm 1 (FIG. 1) is connected by its vertically disposed shaft 2 to a drive 3. Plate-like substrate holders 4 and 5 are provided at the two diametrically opposite ends of the swivel arm 1. The swivel arm 1 is adjacent to a circular turntable 6 which is mounted for rotation on its central shaft 7. At the point of transfer from the substrate holder 5 to the turntable 6 there is an entrance and exit airlock station 8. A coating station 9 and an idle station 10 then follow in the direction of rotation 11 of the turntable 6. The three stations are symmetrically arranged about the axis of rotation of the turntable.

Figure 2:
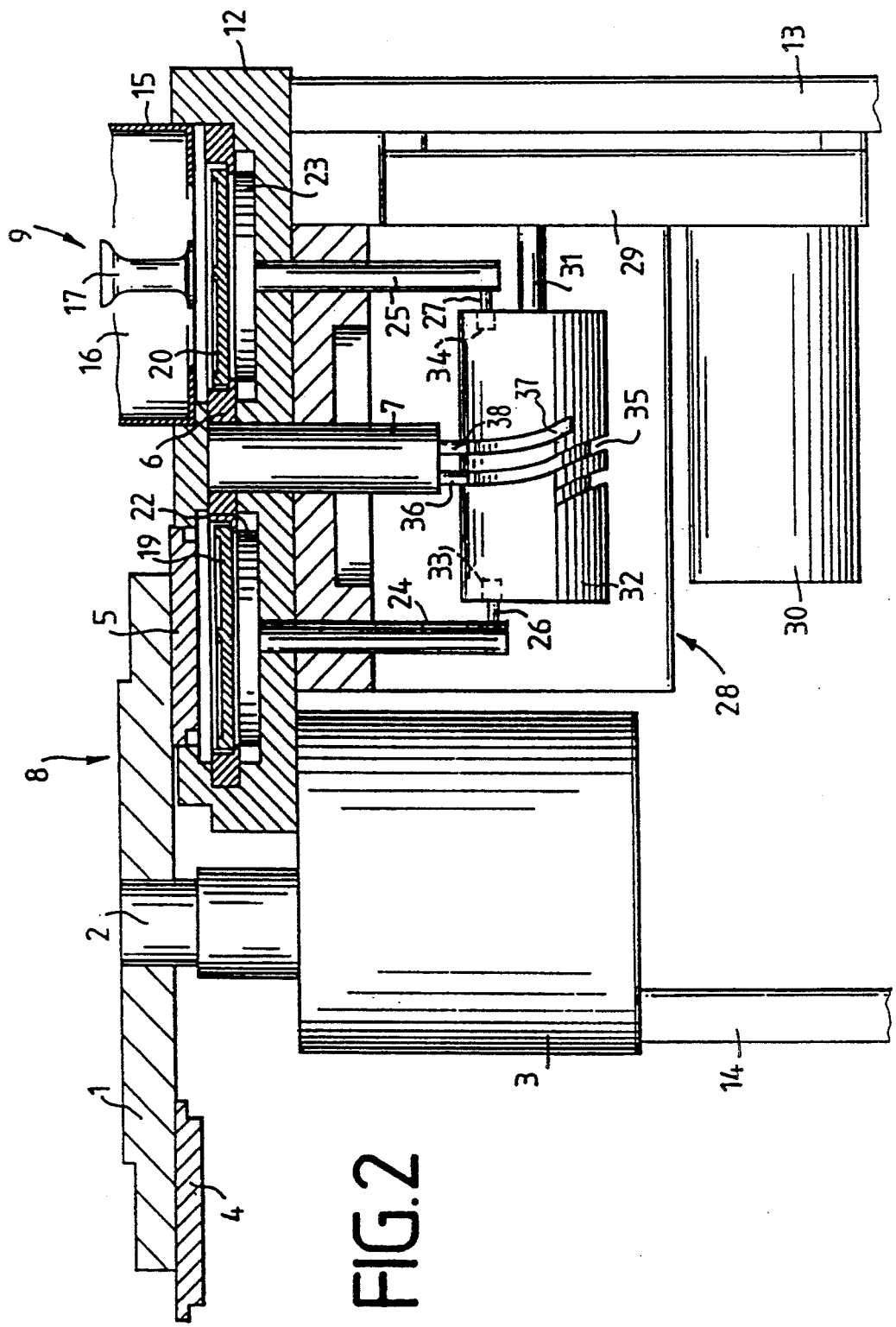
FIG. 2 is a section taken along line XX in FIG. 1, consisting substantially of a gear transmission for the operation of the swivel arm, a turntable for the substrates, and the rotating cylinder which drives the turntable and substrate lifters.

The swivel arm 1 (FIG. 2) is fastened on the upper end of the shaft 2, which in turn engages the drive 3. The circular substrate holders 4 and 5 are provided on their bottom with a stepped bevel and are movable vertically. The drive 3 is suspended on the one outer end of a bottom plate 12. The bottom plate 12 is supported on posts 13 and 14.

The bottom plate 12 itself is provided with a recess into which the turntable 6 is installed. At the coating station 9, the vacuum coating chamber is restricted by the mask 15, which masks off the central area of the substrate during the coating process.

In the entrance and exit airlock station 8, a substrate holder 19 associated with the turntable 6 is shown nested in a recess in the turntable. The change of vertical position is brought about by a raising and lowering of the first substrate plate 22 which is connected to a vertically disposed lifter rod 24.

Components provided at the coating station 9 are comparable with those at the entrance and exit airlock station 8. The substrate holder 20 is shown in the lower position. Here again a substrate plate 23 is connected to a movable lifter rod 25.

These two lifter rods 24 and 25 extend into the housing of the drive 28, which is coupled to the electric motor 30 by chain or shaft in support 29. In the drive 28 there is situated substantially a horizontally journaled shaft 31 at whose end is a cylinder 32. The cylinder 32 is provided at each of its ends with a continuous groove 33 and 34 that follows a curvilinear but not circular course. On the cylindrical surface of the cylinder 32 are grooves 35 and 37 which receive pins 36, 38 on the bottom of shaft 7.

At the bottom ends of the two pusher rods 24 and 25, respective pins 26 and 27 are mounted radially, and are guided in the grooves 33 and 34. The connecting rods 24 and 25 are raised and lowered axially by grooves 33 and 34 in respective ends of cylinder 32.

Figure 3:
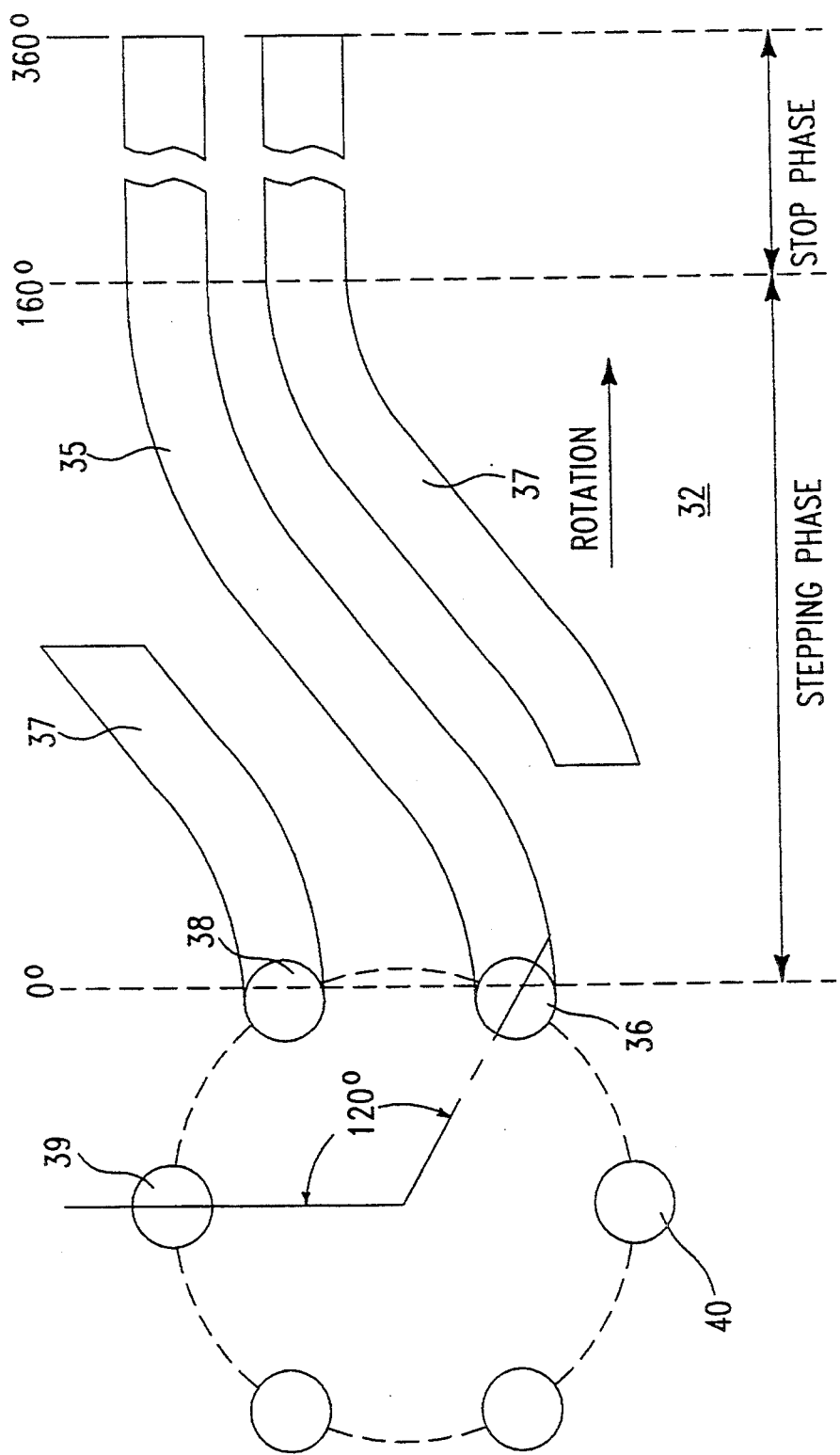
FIG. 3 is a plan view of the cylindrical surface showing the timing grooves for rotary movement of the turntable.

FIG. 3, shows the cylindrical surface of drum 32 in greater detail. The groove 35 receives the pin 36 and moves it to the position of pin 39 as the cylinder 32 rotates through 160 degrees. This causes the shaft 7 to rotate through 120 degrees, and thus rotates the turntable through 120 degrees between stations. Meanwhile, the groove 37 receives pin 40 and moves it through 120 degrees to the position of pin 38.

After the cylinder 32 has rotated through 160 degrees, the grooves 35 and 37 become parallel and straight for 200 degrees of rotation, which causes the turntable to stop rotating during this time. During this stop phase, the push rods 24 and 25 are moved vertically to exchange substrates at the airlock station 8, and to coat a substrate at the coating station 9.

Figure 4:
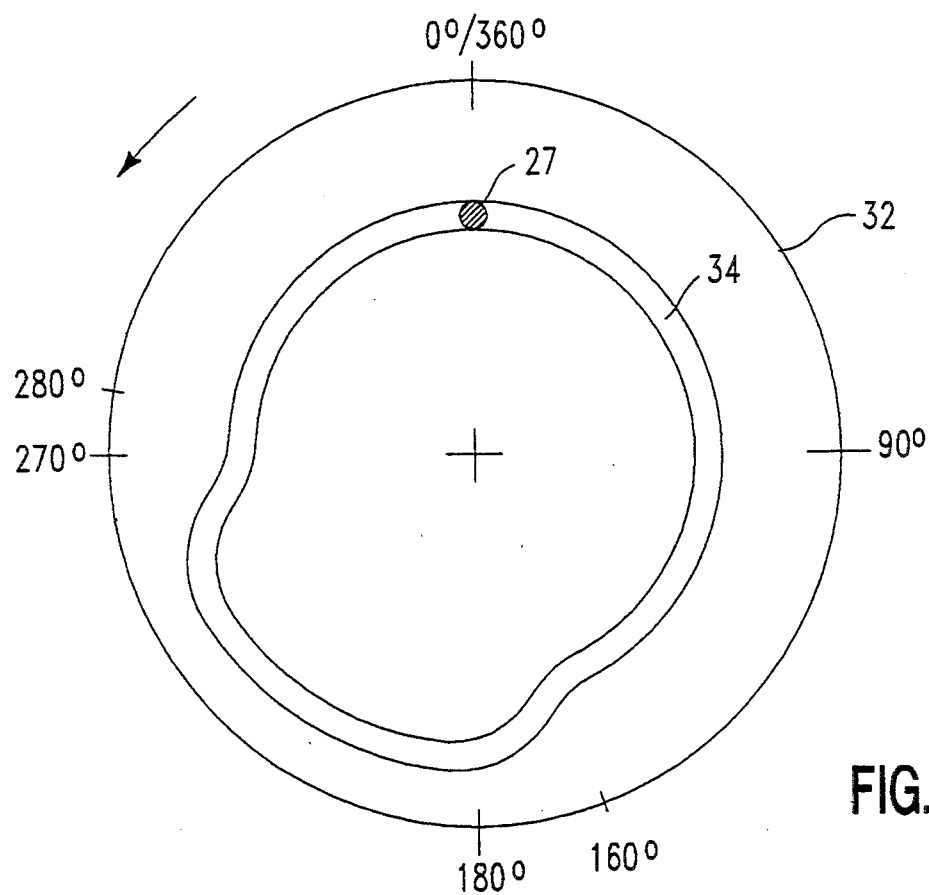
FIG. 4 is a left end view of the cylinder showing the timing groove for the first substrate plate.
Figure 5:
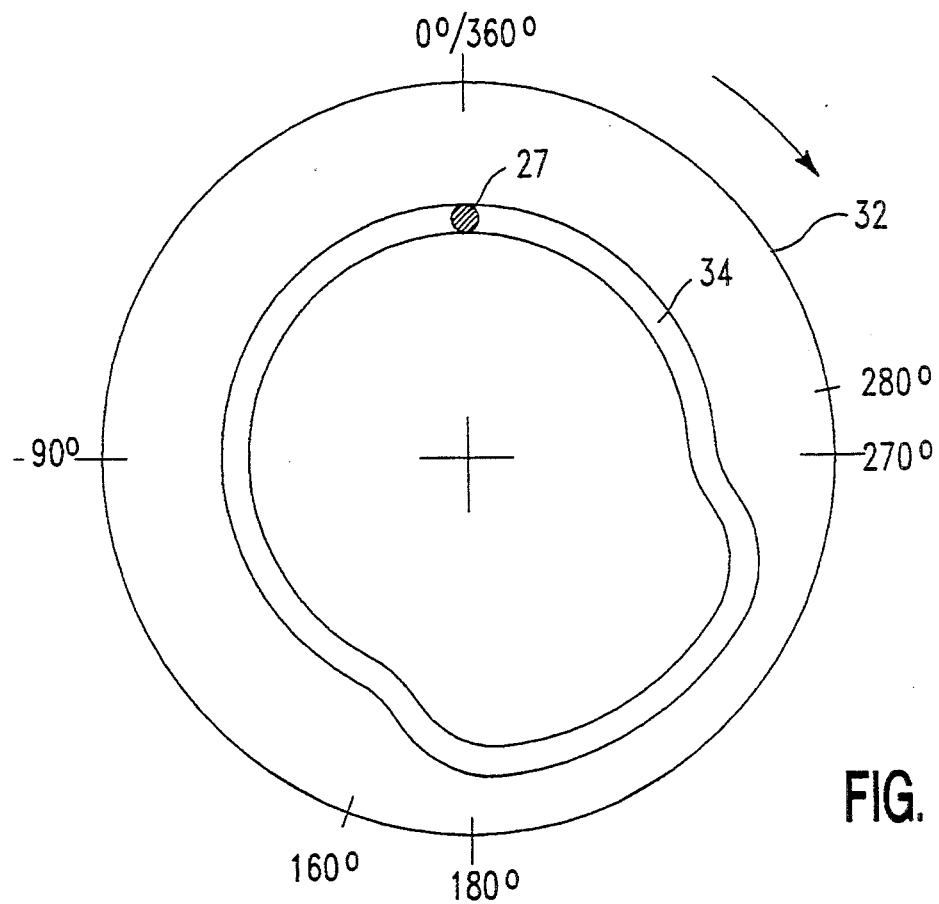
FIG. 5 is a right end view of the cylinder showing the timing groove for the second substrate plate.

FIG. 4 shows the cam groove 33 which receives the pin 26 in the left end of cylinder 32. FIG. 5 shows the cam groove 34 which receives the pin 27 in the right end of cylinder 32. The grooves 33, 34 are profiled to lift the pins 26, 27 simultaneously as the cylinder rotates between 160 and 280 degrees. During this time the lifting plates 22, 23 rise and fall, returning to the position of FIG. 2.

The foregoing is exemplary and not intended to limit the scope of the claims which follow.

I claim:

1. Apparatus for loading and unloading substrates into and out of a vacuum coating chamber and for transporting substrates within said chamber, said apparatus comprising
    a first station where substrates are received and discharged from said coating chamber,
    a second station where substrates are coated,
    a rotatable substrate holder for moving substrates stepwise from said first station to said second station, said first and second stations being separated by a stepwise angle,
    first lifting means for lifting a substrate from said holder at said second station, and
    drive means comprising a rotatable cylinder having a cylindrical surface with groove means therein and opposed end surfaces each having groove means therein, a plurality of pins fixed relative to said substrate holder and cooperating with said groove means in said cylindrical surface to effect stepwise movements of said substrate holder, said stepwise movements being separated by pauses, and pin means fixed relative to each of said first and second lifting means and cooperating with said groove means in each of said end surfaces to effect lifting movements of said first and second lifting means, said lifting movements occurring during said pauses.

2. Apparatus as in claim 1 wherein said groove means in said end surfaces are profiled to effect simultaneous lifting movement by said first and second lifting means.

3. Apparatus as in claim 1 wherein said groove means in said cylindrical surface comprises a groove which receives at least one of said pins fixed relative to said substrate holder and thereby rotates said substrate holder through said stepwise angle during each complete rotation of said cylinder.

4. Apparatus as in claim 3 wherein said groove means in said cylindrical surface comprises a plurality of grooves which each receives a respective pin fixed relative to said substrate holder and thereby rotates said substrate holder through said stepwise angle during each complete rotation of said cylinder.

5. Apparatus as in claim 3 wherein each said groove has a straight section which effects said pause as said at least one of said pins is guided through said straight section during rotation of said cylinder.

* * * * *